United States Patent [19]
Serfaty

[11] Patent Number: 5,111,483
[45] Date of Patent: May 5, 1992

[54] TRELLIS DECODER

[75] Inventor: Salomon Serfaty, Kibutz Gaash, Israel

[73] Assignee: Motorola, Inc., Schaumburg, Ill.

[21] Appl. No.: 596,450

[22] Filed: Oct. 12, 1990

Related U.S. Application Data

[63] Continuation-in-part of Ser. No. 390,564, Aug. 7, 1989, abandoned.

[51] Int. Cl.$^5$ .............................................. H04L 27/06
[52] U.S. Cl. .................................. 375/94; 371/43
[58] Field of Search ................ 375/39, 57, 58, 94, 375/60; 455/50, 63, 60; 371/43; 370/20

[56] References Cited

U.S. PATENT DOCUMENTS

4,945,549  7/1990  Simon et al. ........................... 375/57

Primary Examiner—Benedict V. Safourek
Assistant Examiner—Tesfaldet Bocure
Attorney, Agent, or Firm—Wayne J. Egan

[57] ABSTRACT

An improved trellis code modulation (TCM) decoder for the land mobile environment is provided. According to the invention, a frequency discriminator is placed at the output of the pilot extraction filter and its output passed through a soft limiter and used to modify the metric used by the Viterbi decoder. Under high signal conditions, the output of the discriminator is small and the Euclidian metric is used. During deep fades and especially during a rapid phase change, the output of the discriminator is large and can be used to modify the metric. While the invention is particularly useful for the land mobile environment, it can easily be applied to other types of pilot assisted TCM schemes over Rayleigh faded channels.

10 Claims, 7 Drawing Sheets

TRELLIS DECODER

REFERENCE TO EARLIER-FILED U.S. PATENT APPLICATION

This is a continuation-in-part of Salomon Serfaty, "Improved Trellis Decoder," application Ser. No. 07/390,564, filed Aug. 7, 1989, now abandoned.

BACKGROUND OF THE INVENTION

High spectral efficient digital modulation over radio channels requires the use of multilevel/multiphase signals. This type of signal is very sensitive to time-varying amplitude and phase distortion associated with land mobile communications caused by Rayleigh fading.

Prior art systems have addressed this problem by transmitting a carrier pilot with the data modulation. This pilot is used at the receiver to compensate for the time varying amplitude and phase distortion mentioned above. Usually the pilot is extracted at the receiver by a bandpass filter. Assuming there is no frequency offset between the transmitter and the receiver, the design of the bandpass pilot extraction filter must take into consideration the following conflicting goals:

First, its bandwidth must be wide enough to pass the spectrum associated with the Rayleigh faded pilot signal.

Second, its bandwidth must be narrow enough to preserve the spectral efficiency of the system, and also to keep the noise associated with the pilot extraction as low as possible.

To improve the sensitivity of the transmission system without increasing its bandwidth, trellis coded modulation (TCM) is used. TCM schemes use redundant nonbinary modulation, in combination with a finite state encoder that governs the selection of modulation signals to generate coded signal sequences. Historically TCM has been used to improve the transmission performance over channels where the main source of errors is additive noise. Recently TCM has been proposed to combat the effect of Rayleigh fading in mobile communications. However, there are problems with this approach, as follows:

In a pilot aided transmission, the phase and amplitude of the Rayleigh fading component could be known if the bandwidth of the pilot extraction filter were sufficiently wide and if there were no noise associated with the pilot extraction. However, this is unrealistic, since the limited bandwidth of the pilot extraction filter makes that during deep fades, when rapid phase variations are more likely to appear, the output of the filter cannot follow the phase at its input. Also, the noise associated with the pilot extraction is high.

Further, at the receiver, a Viterbi decoder with Euclidian metric is used to recover the transmitted information from the trellis coded sequence. This type of decoder is optimum if the noise associated with the samples at the channel output is Gaussian and its samples taken at the symbol rate are uncorrelated. However, neither assumption would apply in the case of land mobile radio receivers.

As a result of the above, the use of a Viterbi decoder with Euclidian metric in a Rayleigh fading environment makes performance of the TCM scheme worse than its uncoded counterpart. The reason for this is the rapid phase variation when the signal undergoes a deep fade. Therefore, there is a need for an improved TCM decoder for the land mobile environment.

SUMMARY OF THE INVENTION

Therefore, it is an object of the present invention to provide an improved TCM decoder for the land mobile environment. Accordingly, an improved TCM decoder is disclosed whereby a frequency discriminator is placed at the output of the pilot extraction filter. The discriminator output is then passed through a soft limiter whose output ("s") is used to modify the metric used by the Viterbi decoder. Under high signal conditions, s equals zero and the Euclidian metric is used. During deep fades and especially during a rapid phase change, however, s is positive but less than 1, and can be used to modify the metric in the following way:

$$m = (1-s)d^2$$

where $1 > s \geq 0$, d is the Euclidian distance, and m is the actual metric used by the Viterbi decoder.

DETAILED DESCRIPTION OF THE INVENTION

Figure 1:
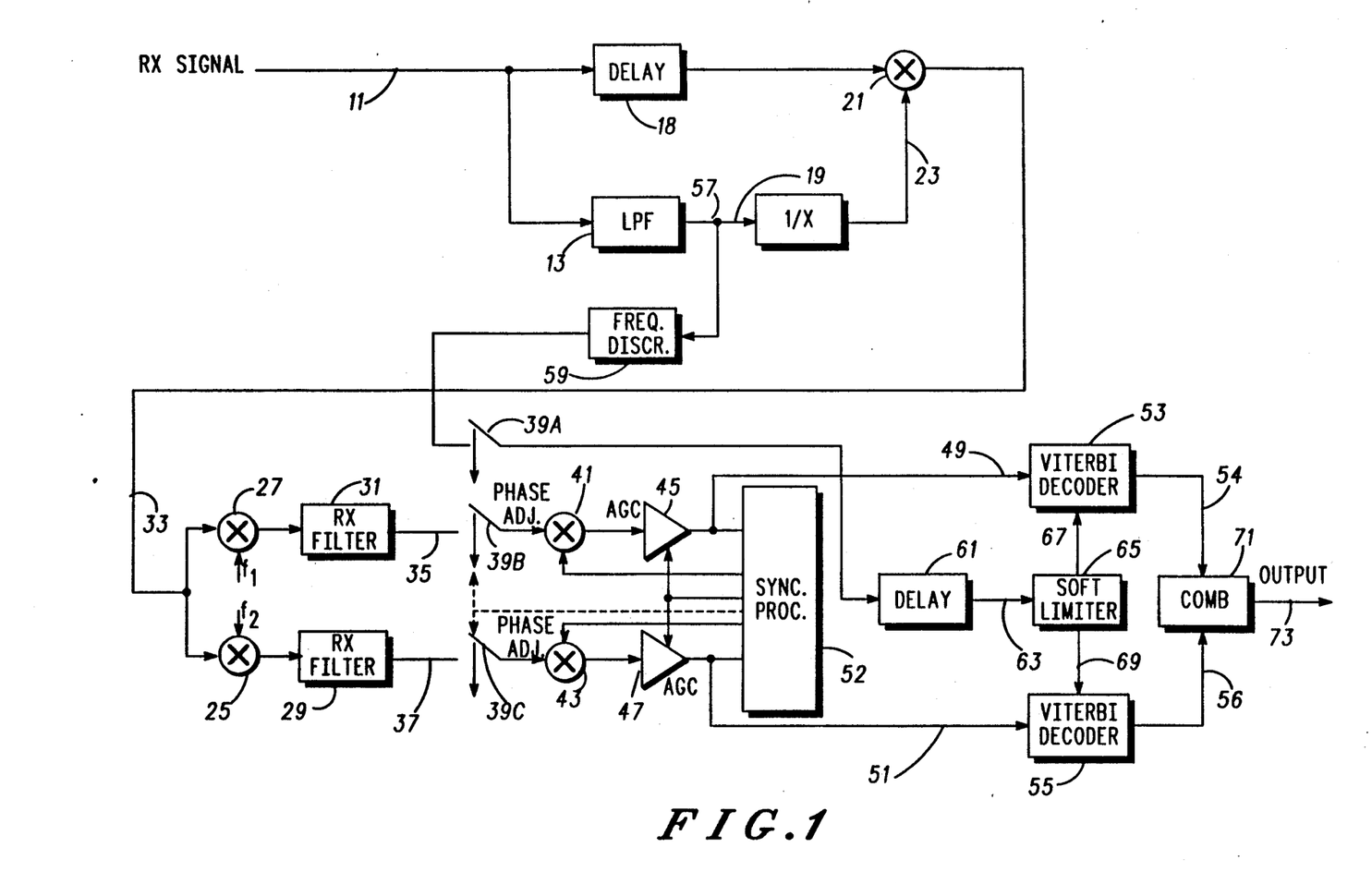
FIG. 1 is a block diagram that shows a first embodiment of an improved TCM decoder according to the invention.

FIG. 1 is a block diagram that shows a first embodiment of an improved TCM decoder, according to the invention.

Referring to FIG. 1, the received signal 11 comprises a pilot and at least one modulated signal conveying digital information. It will be appreciated that the signal 11 may include a multiplicity of modulated signals. In this case, the multiple modulated signals may be at frequencies above or below the pilot, or else certain of the modulated signals may be at frequencies above the pilot, while others may be at frequencies below the pilot.

The modulation type may be, for example, quadrature amplitude modulation ("QAM"). Other modulation types are also possible.

The pilot signal may be, for instance, center band or band-edge.

In what follows, it will be assumed that the received signal 11 comprises a pilot and two QAM signals, the first at 5 KHz above the pilot (herein referred to as "UQAM"), the second at 5 KHz below the pilot (herein referred to as "LQAM").

As shown by FIG. 1, the first step is to extract the pilot from the composite received signal 11. This is done via a low pass filter (LPF) 13. The output 57 in inverted (1/x) and used to multiply the incoming signal 11 via multiplier 21. This path 23 acts as a feedforward automatic gain control. The delay 18 is necessary to off-set for the processing delay of the LPF 13.

After processing, the output of multiplier 21 is next applied to mixers 25 and 27 via nodal point 33. As will be seen, subsequent to (or downstream of) node 33, each individual modulated signal is separately and independently processed by its own dedicated processing path. Since we have assumed received signal 11 comprises two modulated signals—UQAM and LQUAM—, then two processing paths are provided, one for each modulated signal. Thus, the first signal, UQAM, is processed by the path consisting of mixer 27, RX Filter 31, sampler 39B, phase adjuster 41, automatic gain control (AGC) 45, and Viterbi Decoder 53. Similarly, the second signal, LQAM, is processed by the path consisting of mixer 25, Filter 29, sampler 39C, phase adjuster 43, AGC 47, and Viterbi Decoder 55. It will be appreciated that, in the event received signal 11 contained only one modulated signal, the only one processing path downstream of node 33 would be needed. Similarly, it will be further appreciated that, in the event received signal contained an arbitrary number (n) of modulated signals, then a like number (n) of processing paths would be needed.

As shown by FIG. 1, the output of multiplier 21 is next input to mixers 25 and 27 via node 33. Mixer 27 frequency shifts UQAM to a desired intermediate frequency by a spectral amount equal to $f_1$. Similarly, mixer 25 frequency shifts LQAM to a desired intermediate frequency by a spectral amount equal to $f_2$. Assuming UQAM and LQAM are each off-set from the desired intermediate frequency by 5 KHz, then $f_1 = 5$ KHz and $f_2 = 5$ KHz. As a result, with the proper 5 KHz up mixing by a mixer 25 and with the proper 5 KHz down mixing by a mixer 27, and with appropriate filtering by RX filters 29 and 31, the composite signal present at node 33 is separated into its two modulated signal components, UQAM at node 35 and LQAM at node 37.

The UQAM component at node 35 is then sampled at the symbol rate by sampler 39B, phase-adjusted by mixer 41, and gain-corrected by AGC 45. Similarly, the LQAM component at node 37 is sampled at the symbol rate by sampler 39C, phase-adjusted by mixer 43, and gain-corrected by AGC 47. Synchronization and timing for these processes (sampling, phase-adjusting, and gain-correcting) is provided by synchronization processor 52. The processed samples 49 and 51 are then input to two Viterbi decoders 53 and 55, each one operating on one sample stream.

Figure 2:
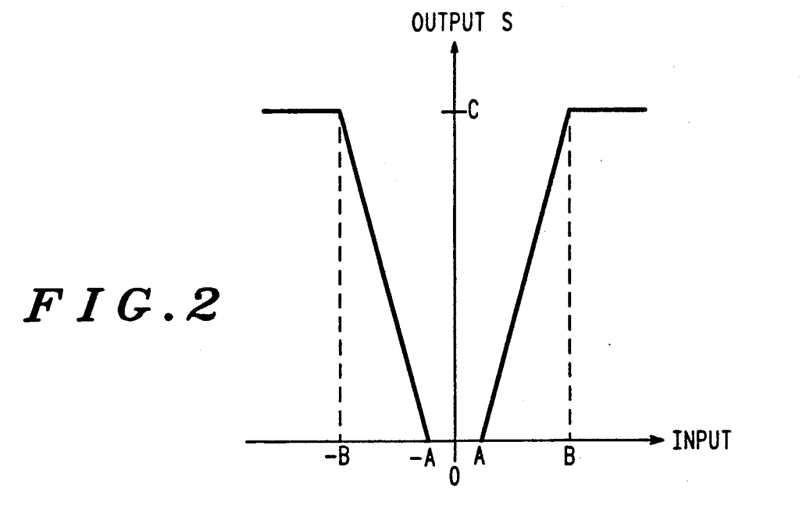
FIG. 2 is a graph showing the characteristics of the soft limiter of the first embodiment.
Figure 12:
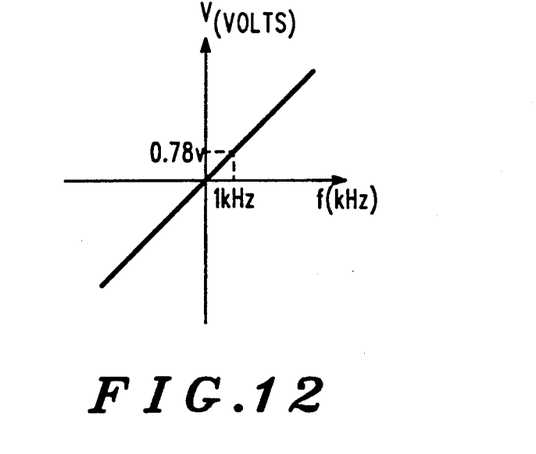
FIG. 12 shows the input-output characteristics of the frequency discriminator, element 59 in FIG. 1.

The output 57 of the LPF 13 is passed through a frequency discriminator 59, sampled by sampler 39A, and delayed by delay line 61 to match the delay through the RX filters 29 and 31 of the UQAM and LQAM components. The input-output characteristics of frequency discriminator 59 are shown in 12. This signal 63 is then passed through a soft limiter 65 whose input-output characteristics are depicted in FIG. 2 (see below). The s a output 67 of soft limiter 65 is then used to modify the metric used by the Viterbi decoder 53. Similarly, the s output 69 of soft limiter 65 is used to modify the metric used by Viterbi decoder 55. The metric ("m") used by each Viterbi decoder 53 and 55 is described by the following equation:

$$m = (1-s)d^2$$

where d is the Euclidian distance normally used by the Viterbi decoder.

Finally, the decoded UQAM output 54 is combined with the decoded LQAM output 56 by combiner 71, and the result provided to output 73. It will be appreciated that, in the event the RX signal 11 contained only one modulated signal, then this final combining step would be unnecessary. Similarly, in the event the RX signal 11 contained an arbitrary number (n) of modulated signals, then the combiner 71 would combine a like number (n) of decoded outputs.

Referring now to FIG. 2, there is shown a graph showing the characteristics of the soft limiter 65 of the first embodiment of FIG. 1. It will be appreciated that the optimum values for the variables A, B, and C will depend on the specific communication conditions encountered or present at a particular time and thus will vary for each application. The optimum values may be determined for instance, by trial and error. In one laboratory test, the applicant determined one set of optimum values to be as follows: $A=0.022$, $B=0.082$, and $C=0.9$. Results will, of course, vary.

Figure 3:
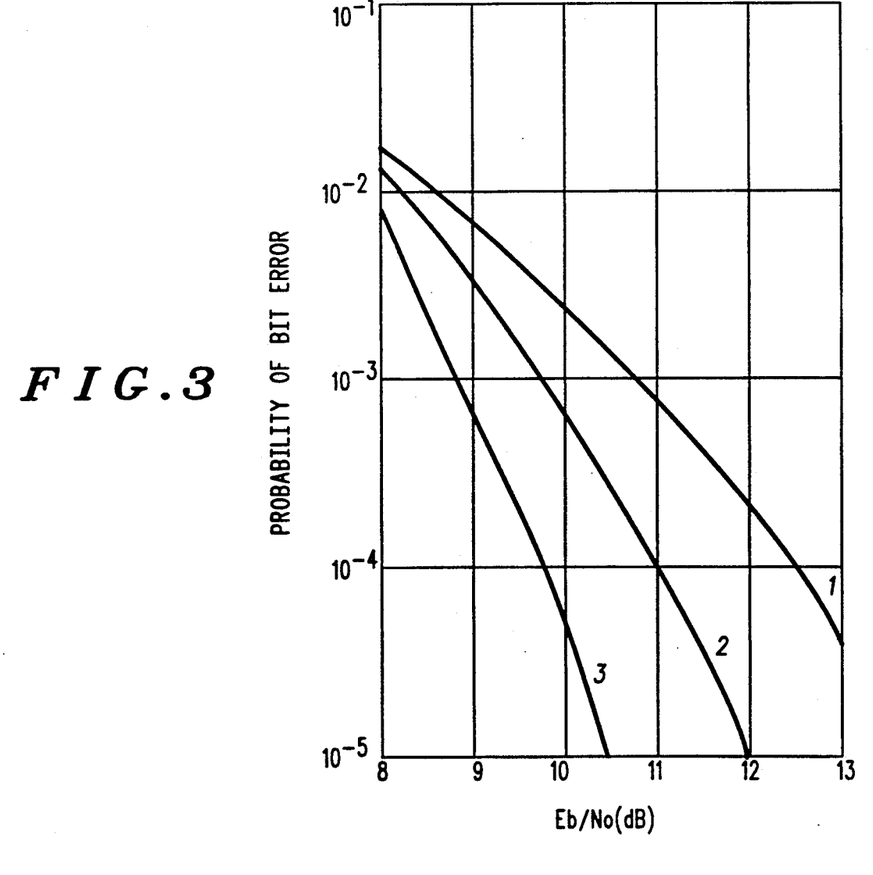
FIG. 3 is a graph showing the performance of a TCM decoder under static conditions.

Referring now to FIG. 3, there is shown a graph showing the performance of a TCM decoder with a 16-QAM constellation for both UQAM and LQAM under static conditions. The performance of the TCM schemes analyzed (four-state and eight-state) under static conditions expressed as probability of bit error versus $E_b/N_o$ are shown. For reference, the performance of a system using uncoded 8AM-PM in both UQAM and LQAM is also presented.

Figure 4:
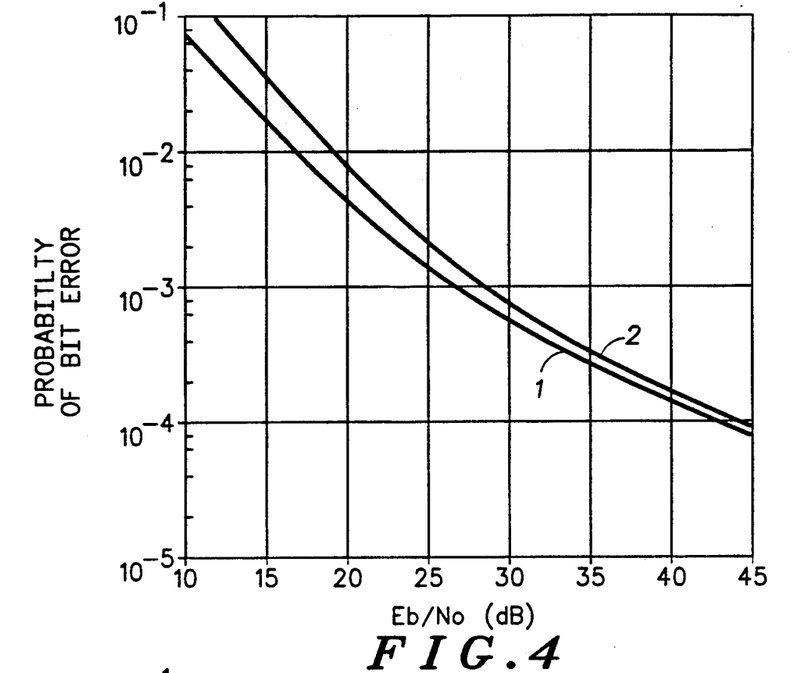
FIG. 4 is a graph showing the performance of a TCM decoder @ 900 MHz under Rayleigh fading conditions assuming a vehicle speed of 55 mph.

Referring now to FIG. 4, there is shown a graph showing the performance of a four-state TCM decoder (using 16 QAM) without any metric modification at a transmission frequency of 900 MHz under Rayleigh fading conditions assuming a vehicle speed of 55 mph. As shown, without metric modification and for the reasons stated above, the performance is worse than the uncoded 8AM-PM scheme.

Figure 5:
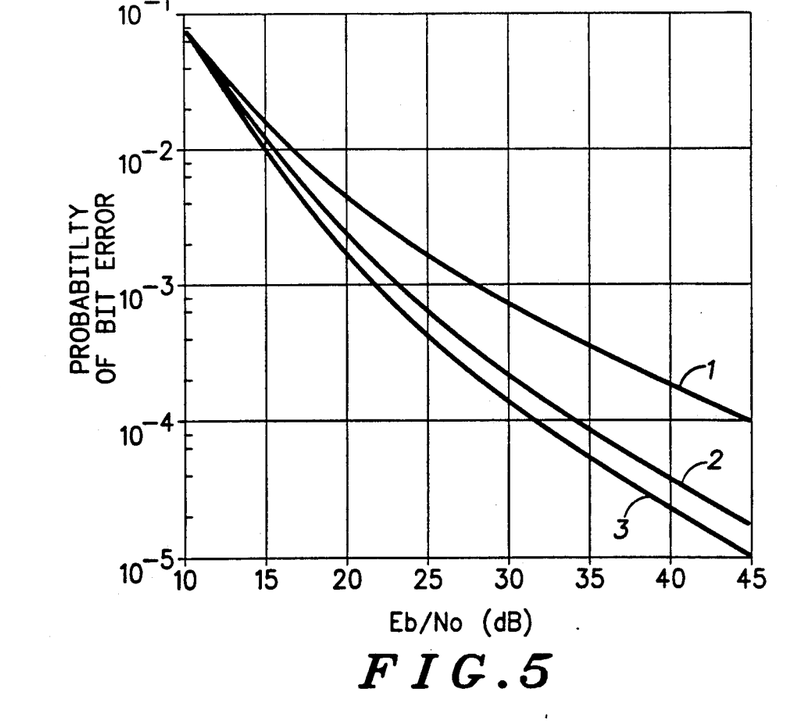
FIG. 5 is a graph showing the performance of the first embodiment under the same conditions as in FIG. 4.

Referring now to FIG. 5, there is shown a graph showing performance of the first embodiment under the same conditions as in FIG. 4. This graph shows the performance of the two schemes under the same propagation conditions of FIG. 4 but using now the improved TCM decoder, according to the invention. Note the big improvement over uncoded modulation especially at high signal-to-noise and the steep descent of the BER as the signal-to-noise ratio is increased.

Those skilled in the art will appreciate that the improved trellis decoder, according to the invention, may be implemented by means of an appropriately-programmed digital signal processor ("DSP"). The DSP56000, available from Motorola, Inc., 1301 East Algonquin Road, Schaumburg, Ill. 60196 is such a DSP, which DSP may be suitably programmed in accordance with user's manual #DSP56000UM/AD, also available from Motorala, Inc.

The following supplemental material discusses the need and the advantage of the modified Viterbi decoder, and is useful in understanding the underlying theory of the invention.

Figure 6:
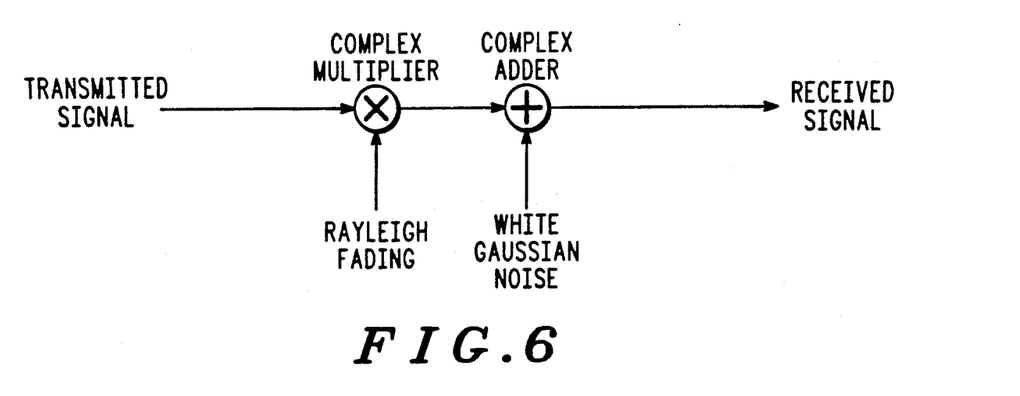
FIG. 6 is a baseband equivalent model of mobile communication system.

To begin, further explanation may be helpful regarding the pilot signal, and why it is used. High spectral efficiency digital modulation over radio channels requires the use of multilevel/multiphase signals. This type of signal is very sensitive to time varying amplitude and phase distortion due to the Rayleigh fading inherent to this communication system. A model of a land mobile communication system is shown in FIG. 6.

Figure 7A:
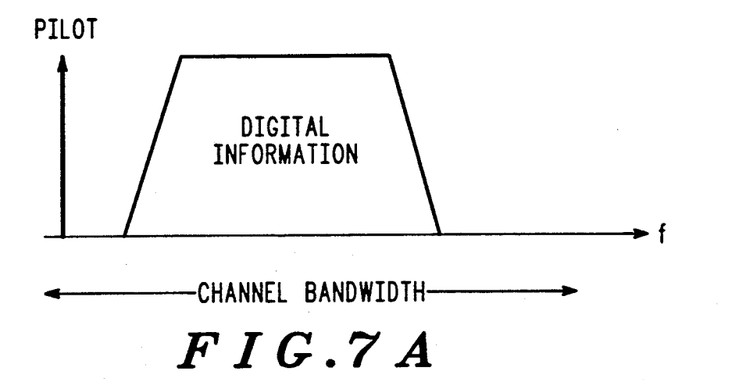
FIG. 7A is a frequency spectrum diagram for pilot-base transmission system with a band edge, pilot.
Figure 7B:
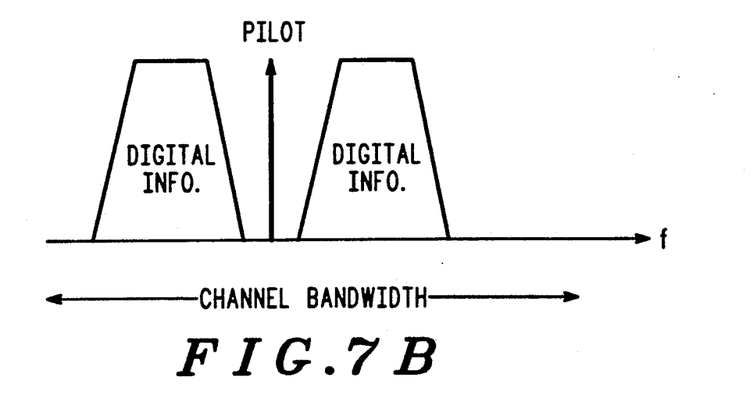
FIG. 7B is a frequency spectrum diagram for pilot-based transmission system with a band-center pilot.

In order to overcome this problem, it is known that a pilot signal can be sent together with the information signal. Given the RF communication channel, the pilot can be placed anywhere in the transmission band. FIGS. 7A-B show some typical cases, i.e., a pilot at the edge of the channel (FIG. 7A) and a pilot in the center of the channel (FIG. 7B). The band centered pilot arrangement of FIG. 7B is preferred in some applications in order to avoid continuous interference in an adjacent channel. At the receiver, assuming that the channel is non-selective (flat fade), the distortion due to the Rayleigh fading component is identical for the pilot and for the data signal. The received pilot is used in order to compensate for this time varying distortion in a feedforward automatic gain control fashion. This is expressed schematically in FIG. 8.

Figure 9A:
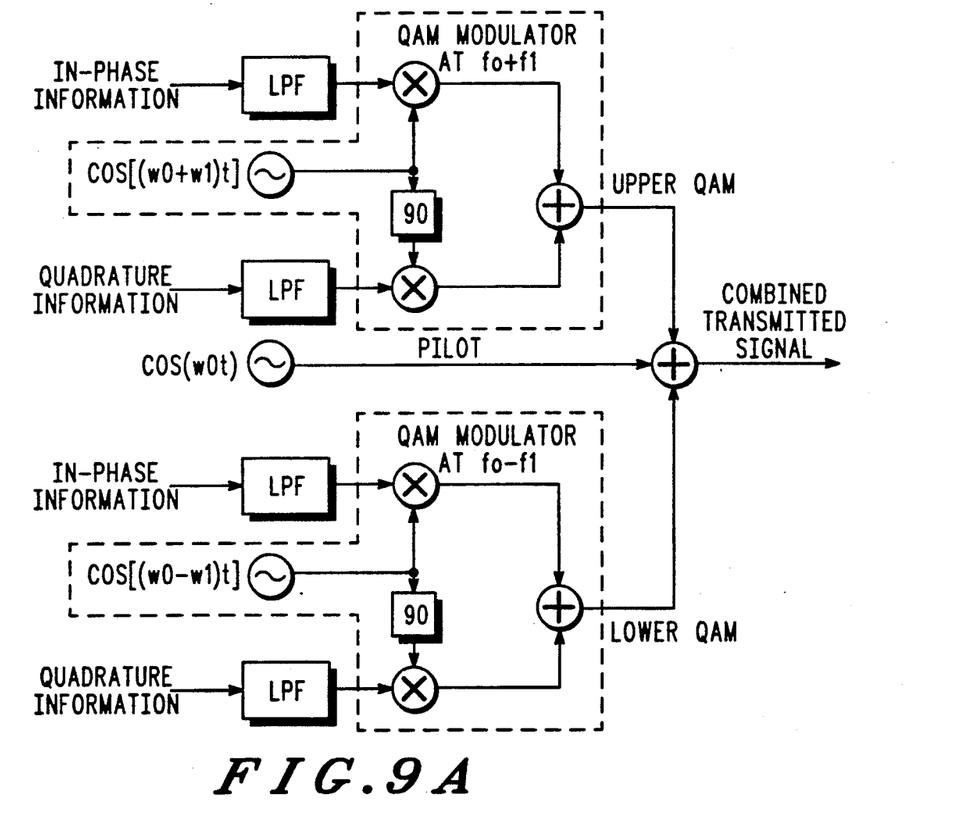
FIG. 9A is an RF model of a transmitter with a band-center pilot and two QAM digital information signals.
Figure 9B:
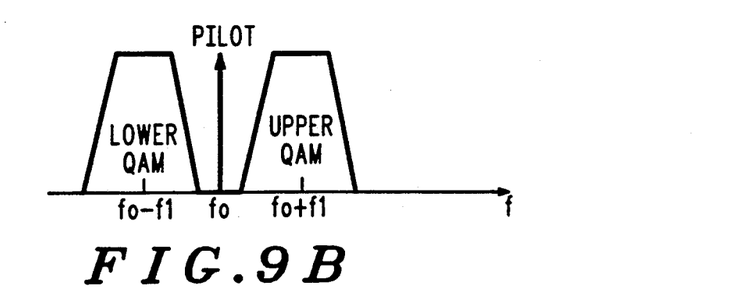
FIG. 9B is a frequency spectrum diagram for the combined transmitted signal of the transmitter of FIG. 9A.
Figure 10A:
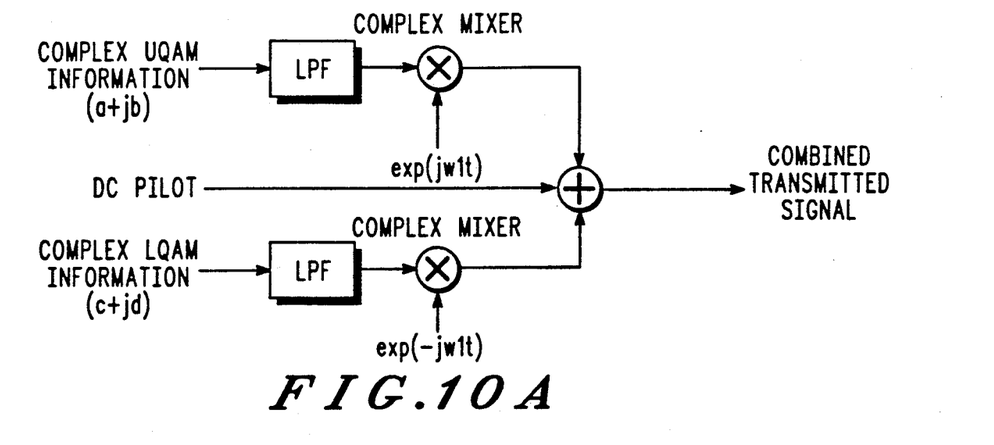
FIG. 10A is a base-band equivalent model of a transmitter with a band-center pilot and two QAM digital information signals.

The upper and lower QAM signals will now be discussed. It will be appreciated that the upper and lower QAM signals do not refer to the in-phase and quadrature components of the quadrature amplitude modulated signals, but rather to their relative position in the frequency domain with respect to the pilot frequency. In the present invention, a center frequency pilot is used, that is, the pilot is placed in the middle of the RF transmission band. Two quadrature amplitude modulated signals are placed to each side of the pilot. From here, the names upper QAM (UQAM) and lower QAM (LQAM) are derived. This is more precisely seen in FIGS. 9A-B and FIGS. 10A-B. Referring now to these figures, in FIGS. 9A-B there is shown an RF model of the transmitter used in the present invention, while in FIGS. 10A-B there is shown a baseband equivalent model. This particular scheme uses a band centered pilot. If a band edge pilot were to be used, only one QAM signal would be used on one side of the pilot.

Figure 8:
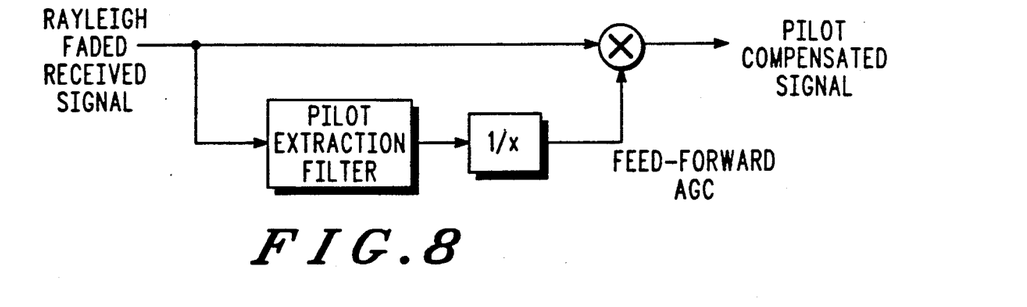
FIG. 8 is a block diagram of a pilot-compensated receiver.

Some clarifying details about the receiver of the present invention are now discussed. The first thing done in the receiver is a pilot extraction process and pilot compensation, as shown in FIG. 8. The engineering considerations leading to the design of the lowpass filter needed in the pilot extraction process are disclosed hereinabove. If it is assumed that the pilot correction process is ideal, then the signal information remaining after pilot compensation is a first complex QAM signal centered at frequency $f_1$ and a second complex QAM signal centered at $-f_1$, as shown in FIG. 10B.

Figure 10B:
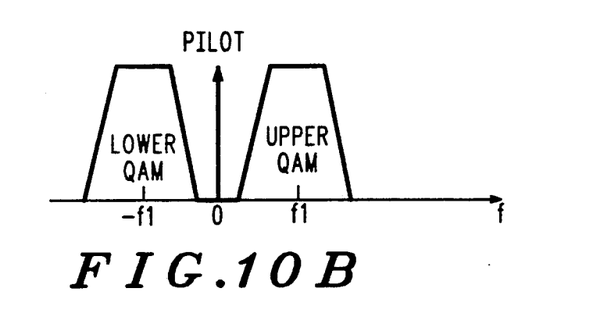
FIG. 10B is a baseband equivalent frequency spectrum diagram for the combined transmitted signal of the transmitter of FIG. 10A.

Referring still to FIG. 10B, it will be appreciated that at this point the signal needs to be separated into its two QAM components (not to be confused with the I and Q components of the individual QAM signals). This signal processing is depicted in FIG. 1, as described hereinabove. Referring now to FIG. 1, the signal is split in two branches, one processing the UQAM signal and the second processing the LQAM signal. As a result of the mixer 27, the LQAM signal, which is centered at $-f_1$, is translated to DC (centered around zero Hertz) and extracted by means of the RX filter 31. This filter 31 rejects at its output the UQAM signal as well as the pilot signal. With $f_2 = -f_1$, the same process is repeated for the UQAM signal, using mixer 25 and RX filter 29. From this point to the final output 73, the signal processing functions in the two branches—including phase adjustment, AGC, sampling, and decoding via the Viterbi decoders 53 and 55—are identical.

The metric modifier parameter 's' will now be discussed. In a communication channel whose only impairment is additive white Gaussian noise (AWGN), the decoding of trellis coded modulation signals is done by means of a Viterbi decoder. In this case, it can be shown that the optimum metric to be used by the Viterbi decoder is equal to the Euclidian distance. That is, in the decoding process, the decoder computes the squared distance between the received sample at the output of the channel and the points of the transmitted constellation. Mathematically, this can be expressed as $$d^2 = |r_n - a_i|^2$$

where $\{a_i\}$ are the points of the complex QAM constellation. For example, in the 16QAM system as discussed above for FIG. 3, $\{a_i\}$ can have one of the following values:

$$\{1+j1, 1+j3, 3+j1, 3+j3, -1+j1, -1+j3, -3+j1,$$
$$-3+j3, 1-j1, 1-j3, 3-j1, 3-j3, -1-j1,$$
$$-1-j3, -3-j1, -3-j3\}.$$

The metric modifier operates in the following way: a frequency discriminator centered at DC and whose sensitivity is equal to R Volts/Hz is placed at the output of the pilot detection filter. Assume for the moment that the channel is not Rayleigh faded, then the output of the discriminator will be equal to zero since the only thing it sees at its input is a DC voltage (0 Hz) corresponding to the pilot. The metric modification scheme of the present invention stipulates that the metric to be used by the Viterbi decoder is equal to $$m = d^2(1-s)$$

where s is the output of the soft-limiter designated as element 65 in FIG. 1. In this case (no Rayleigh fading), it can be seen from FIG. 2 that for an input equal to zero, the output s of the soft-limiter is also equal to zero and therefore no modification is introduced in the metric used by the Viterbi decoder.

In a Rayleigh fading situation, it is well known that during a deep fade, rapid changes occur in the phase of the Rayleigh fading component. Due to the limited bandwidth of the pilot extraction filter, those rapid changes cannot be precisely followed at its output. Since rapid changes in the phase correspond to large frequency excursion (frequency is equal to the derivative of the phase), those can be detected by monitoring the output of the discriminator. Therefore in the present invention, the discriminator allows us to detect when a rapid change in the phase of the Rayleigh fading component is taking place which also corresponds to a deep fade. In such a deep fade situation, the quality of the received signal is poor. Referring again to FIG. 2, it is seen that when the absolute value at the output of the discriminator exceeds 'B', the output s of the soft limiter is equal to 'C'. In the example given, C=0.9, which means that, in this case, the metric used by the Viterbi decoder is equal to $$m = d^2(1-0.9) = (0.1)d^2$$

In a very simplified but illustrative way, the Viterbi decoder is modified to give less weight to the metric when a deep fade occurs.

It will be appreciated that the parameters A, B and C of the soft-limiter are a function of the particular application and of R (the discriminator sensitivity). A and B help determine when a deep fade condition occurs, and should be a function of the sensitivity to fades of the data transmission system under consideration. In the example discussed above for FIG. 3, the system uses 16QAM constellations and has a transmission frequency of 900 MHz. The Rayleigh fading corresponds to a vehicle traveling at a speed of 55 mph. The trellis codes used have 8 and 16 states. The discriminator used has a sensitivity of 0.78 volts/KHz. Through simulations, it was found that the best parameters for A, B and C are those reported hereinabove, i.e., A=0.022, B=0.082 and C=0.9.

Figure 11A:
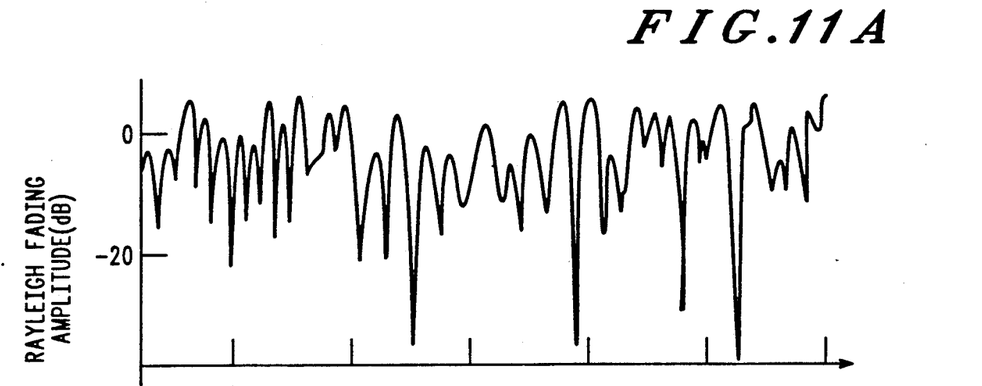
FIGS. 11A–C shaw an example of the behavior of the metric modifier according to the invention, as a function of time.
Figure 11B:
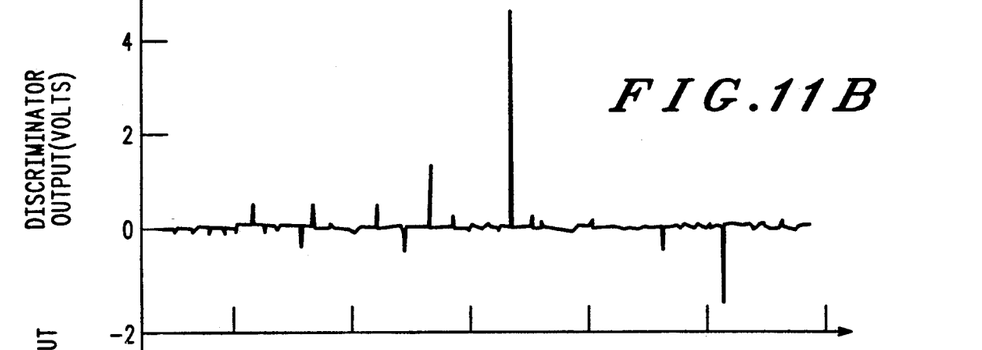
Figure 11C:
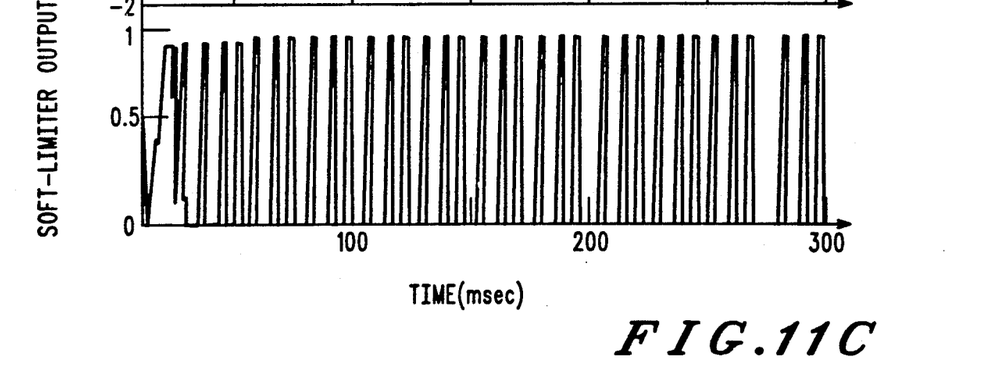

An example of the behavior of the metric modifier as a function of time for a specific run is presented in FIGS. 11A–C. FIG. 11A shows the Rayleigh fading component associated with the land mobile channel for a transmission frequency of 900 MHz and for a vehicle speed of 55 mph. FIG. 11B shows the output of the discriminator. Observe in this figure that the 'spikes' at the output of the discriminator correspond to deep fades in the channel. FIG. 11C shows the metric modifier s. It may be observed that for a 'good' signal (no fade), this metric modifier is equal to zero while when a very deep fade occurs, it is equal to 0.9.

The beneficial effect of the technique disclosed may be clearly seen by comparing FIGS. 4 and 5, as discussed hereinabove.

While various embodiments of the improved trellis decoder, according to the invention, have been described herein, the scope of the invention is defined by the following claims.

What is claimed is:
1. A method for decoding a received signal comprising at least one trellis coded modulated signal and a center-band pilot signal containing a Rayleigh-faded component, comprising the steps of:
 (a) filtering said received signal to extract said center-band pilot signal, thus providing an extracted center-band pilot signal;
 (b) applying said extracted center-band pilot signal to a frequency discriminator to provide a frequency discriminator output;
 (c) applying said frequency discriminator output to a soft limiter to provide a metric modifier ("s");
 (d) decoding said at least one trellis coded modulated signal using at least one Viterbi decoder whose metric ("m") is modified responsive to the formula:

$$m = (1-s)d^2$$

where $1 > s \geq 0$, and d is the Euclidian distance.

2. A radio having a decoder for decoding a received signal comprising at least one trellis coded modulated signal and a center-band pilot signal containing a Rayleigh-faded component, said decoder comprising:
 means for filtering said received signal to extract said center-band pilot signal, thus providing an extracted center-band pilot signal;
 means for applying said extracted center-band pilot signal to a frequency discriminator to provide a frequency discriminator output;
 means for applying said frequency discriminator output to a soft limiter to provide a metric modifier ("s");
 means for decoding said at least one trellis coded modulated signal using at least one Viterbi decoder whose metric ("m") is modified responsive to the formula:

$$m = (1-s)d^2$$

where $1 > s \geq 0$, and d is the Euclidian distance.

3. A radio having a trellis coded quadrature amplitude modulation (QAM) decoder for decoding a received signal comprising an upper QAM (UQAM) signal and a lower QAM (LQAM) signal and a center-band pilot signal containing a Rayleigh-faded component, said decoder comprising:
 means for filtering said received signal to extract said center-band pilot signal, thus providing an extracted center-band pilot signal;
 means for applying said extracted center-band pilot signal to a frequency discriminator to provide a frequency discriminator output;
 means for applying said frequency discriminator output to a soft limiter to provide a metric modifier ("s");
 means for decoding said UQAM signal using a first Viterbi decoder;
 means for decoding said LQAM signal using a second Viterbi decoder;
 said first and second Viterbi decoders each having a metric ("m") that is modified responsive to the formula:

$$m = (1-s)d^2$$

where $1 > s \geq 0$, and d is the Euclidian distance.

4. A method for decoding a received signal comprising a trellis coded modulated signal and a center-band pilot signal containing a Rayleigh-faded component, comprising the steps of:
 (a) low-pass filtering said received signal to extract said center-band pilot signal, thus providing an extracted center-band pilot signal;
 (b) applying said extracted center-band pilot signal to a frequency discriminator to provide a frequency discriminator output;
 (c) applying said frequency discriminator output to a soft limiter to provide a metric modifier ("s");
 (d) decoding said trellis coded modulated signal using a Viterbi decoder whose metric ("m") is modified responsive to the formula:

$$m = (1-s)d^2$$

where $1 > s \geq 0$, and d is the Euclidian distance.

5. A method for decoding a received signal (11) comprising a center-band pilot signal containing a Rayleigh-faded component, an upper side band trellis coded modulated signal and a lower side band trellis coded modulated signal, comprising the steps of:
(a) low-pass filtering (13) said received signal to extract said center-band pilot signal (57), thus providing an extracted center-band pilot signal;
(b) applying said extracted center-band pilot signal (57) to a frequency discriminator (59) to provide a frequency discriminator output;
(c) applying said frequency discriminator output to a soft limiter (65) to provide a metric modifier ("s") (67,69);
(d) using said metric modifier s to modify the metric ("m") of a first Viterbi decoder (53) and a second Viterbi decoder (55) responsive to the formula;

$$m = (1-s)d^2$$

where $1 > s \geq 0$, and d is the Euclidian distance;
(e) decoding said upper side band trellis coded modulated signal using said first Viterbi decoder (53);
(f) decoding said lower side band trellis coded modulated signal using said second Viterbi decoder (55);
(g) combining (71) the results of step (e) and step (f) to form an output signal (73).

6. The method of claim 1 wherein s is defined by the following equation:

$$s = \begin{cases} 0 & \text{for } |X| < A \\ C(|X| - A)/(B - A) & \text{for } A < |X| < B \\ B & \text{for } |X| > B \end{cases}$$

where the parameters A, B and C are optimized for the particular modulation and frequency discriminator used.

7. The radio of claim 2 wherein s is defined by the following equation:

$$s = \begin{cases} 0 & \text{for } |X| < A \\ C(|X| - A)/(B - A) & \text{for } A < |X| < B \\ B & \text{for } |X| > B \end{cases}$$

where the parameters A, B and C are optimized for the particular modulation and frequency discriminator used.

8. The radio of claim 3 wherein s is defined by the following equation:

$$s = \begin{cases} 0 & \text{for } |X| < A \\ C(|X| - A)/(B - A) & \text{for } A < |X| < B \\ B & \text{for } |X| > B \end{cases}$$

where the parameters A, B and C are optimized for the particular modulation and frequency discriminator used.

9. The method of claim 4 wherein s is defined by the following equation:

$$s = \begin{cases} 0 & \text{for } |X| < A \\ C(|X| - A)/(B - A) & \text{for } A < |X| < B \\ B & \text{for } |X| > B \end{cases}$$

where the parameters A, B and C are optimized for the particular modulation and frequency discriminator used.

10. The method of claim 5 wherein s is defined by the following equation:

$$s = \begin{cases} 0 & \text{for } |X| < A \\ C(|X| - A)/(B - A) & \text{for } A < |X| < B \\ B & \text{for } |X| > B \end{cases}$$

where the parameters A, B and C are optimized for the particular modulation and frequency discriminator used.

* * * * *